(12) United States Patent
Miyamoto

(10) Patent No.: US 12,259,423 B2
(45) Date of Patent: Mar. 25, 2025

(54) DISCHARGE DETECTOR WITH LEARNING MODE FOR RESETTING SETTINGS TO DETECTING OCCURRENCE OF DISCHARGE

(71) Applicant: NITTO KOGYO CORPORATION, Nagakute (JP)

(72) Inventor: Atsushi Miyamoto, Nagakute (JP)

(73) Assignee: NITTO KOGYO CORPORATION, Nagakute (JP)

( * ) Notice: Subject to any disclaimer, the term of this patent is extended or adjusted under 35 U.S.C. 154(b) by 133 days.

(21) Appl. No.: 18/019,591

(22) PCT Filed: Aug. 3, 2021

(86) PCT No.: PCT/JP2021/028685
§ 371 (c)(1),
(2) Date: Feb. 3, 2023

(87) PCT Pub. No.: WO2022/030466
PCT Pub. Date: Feb. 10, 2022

(65) Prior Publication Data
US 2023/0358800 A1    Nov. 9, 2023

(30) Foreign Application Priority Data
Aug. 6, 2020    (JP) .................................. 2020-133522

(51) Int. Cl.
*G01R 31/14* (2006.01)
*G01R 29/26* (2006.01)
*G01R 31/12* (2020.01)

(52) U.S. Cl.
CPC ............ *G01R 31/14* (2013.01); *G01R 29/26* (2013.01); *G01R 31/1272* (2013.01)

(58) Field of Classification Search
CPC .... G01R 29/26; G01R 31/1272; G01R 31/14; G01R 31/52; H02H 3/50
See application file for complete search history.

(56) References Cited

U.S. PATENT DOCUMENTS 6,088,205 A * 7/2000 Neiger ................. H02H 1/0015
361/42
6,525,918 B1 2/2003 Alles et al.
(Continued)

FOREIGN PATENT DOCUMENTS

JP    201521929 A    2/2015
JP    2019184475 A    10/2019
(Continued)

*Primary Examiner* — Jay Patidar
(74) *Attorney, Agent, or Firm* — The Webb Law Firm

(57) ABSTRACT

The discharge detector of the present invention includes a filter circuit configured to pass a noise superimposed on the current or voltage in a predetermined frequency range; an amplifier configured to amplify a level of the noise passed through the filter circuit; and a processor configured to detect occurrence of discharge based on the noise level amplified by the amplifier. The processor is set to have a threshold related to the noise level and a determination time to determine whether discharge has occurred. The processor is capable of selectively executing either one of a discharge detection mode or a learning mode. The processor in the learning mode executes the process of sampling the noise at the level of the threshold or more and resetting the value of the setting of the determination time based on a result of the sampling.

8 Claims, 8 Drawing Sheets

(56) References Cited

U.S. PATENT DOCUMENTS

2012/0275071 A1    11/2012  Gutierrez et al.
2021/0190839 A1*    6/2021  Lim .................... G01R 23/165

FOREIGN PATENT DOCUMENTS

| JP | 2019184480 | A | 10/2019 |
| JP | 2019191142 | A | 10/2019 |
| JP | 2019200068 | A | 11/2019 |
| JP | 202012726 | A | 1/2020 |
| WO | 2018042588 | A1 | 3/2018 |

* cited by examiner

DISCHARGE DETECTOR WITH LEARNING MODE FOR RESETTING SETTINGS TO DETECTING OCCURRENCE OF DISCHARGE

CROSS REFERENCE TO RELATED APPLICATIONS

This application is the United States national phase of International Patent Application No. PCT/JP2021/028685 filed Aug. 3, 2021, and claims priority to Japanese Patent Application No. 2020-133522 filed Aug. 6, 2020, the disclosures of which are hereby incorporated by reference in their entireties.

BACKGROUND OF THE INVENTION

Field of the Invention

The present invention relates to a discharge detector for detecting discharge occurred by an accident, such as tracking, a short circuit, and disconnection.

Description of Related Art

Japanese Patent Application Kokai Publication No. 2019-184480 (Patent Document 1) discloses a discharge detector for detecting discharge occurred in an electrical circuit. The discharge detector is electrically connected to, for example, an electrical circuit, such as indoor wiring. To the electrical circuit, a load, not shown, is electrically connected. The load means, for example, a device operating by consuming electric power, such as a lighting fixture, a display, an air conditioner, and a refrigerator. When an accident, such as tracking, a short circuit, disconnection, and current leakage, occurs in the electrical circuit or the load, discharge takes place between electric wires or between electrodes. When discharge occurs, a noise is superimposed on the voltage or current in the electrical circuit. The discharge detector detects noises in a high frequency band superimposed on the voltage or current by a high pass filter and determines whether discharge has occurred based on such a noise.

PRIOR ART DOCUMENTS

Patent Document

Patent Document 1: Japanese Patent Application Kokai Publication No. 2019-184480

SUMMARY OF THE INVENTION

Problems to be Solved by the Invention

Such a discharge detector is intended to detect discharge occurred by an accident, such as tracking and a short circuit. However, some of the loads electrically connected to such an electrical circuit continuously generate noises at levels more than a threshold set in the discharge detector. For example, fluorescent lamps sometimes continuously generate noises at levels more than the threshold for a while after being turned on. Thus, discharge detectors in the past have a problem of making an erroneous determination that discharge has occurred due to a noise generated by normal operation of a load.

The above problem can be solved if a user is allowed to freely change one or more values of the settings used for determinations by the discharge detector not to cause an erroneous determination that discharge has occurred due to the noise generated by normal operation of a load. However, such a discharge detector in the past has a configuration not allowing a change in the values of the settings, such as a threshold, used for determinations. Even if the discharge detector in the past has a configuration allowing a change in the values of the settings, it is difficult for a less knowledgeable and experienced user to select optimal values of the settings.

The present invention has been made in view of the above problems, and it is an object thereof to provide a discharge detector capable of resetting one or more values of the settings used for determinations whether discharge has occurred by learning the level and duration time of each noise generated by a load.

Means to Solve the Problems (1) A discharge detector of the present invention for detecting discharge occurred in an electrical circuit with an electrically connected load based on a noise superimposed on a voltage or current, the discharge detector includes: a filter circuit configured to pass a noise in a predetermined frequency range; an amplifier configured to amplify a level of the noise passed through the filter circuit; and a processor configured to detect occurrence of discharge based on the noise level amplified by the amplifier, wherein the processor is set to have a threshold related to the noise level and a determination time to determine whether discharge has occurred, the processor is capable of selectively executing either one of a discharge detection mode or a learning mode, the processor in the discharge detection mode executes process of determining whether discharge has occurred by comparing a duration time of the noise at a level of the threshold or more with the determination time, and the processor in the learning mode executes process of sampling the noise at the level of the threshold or more and resetting at least one value of the settings based on a result of the sampling.

(2) It is preferred that, in the discharge detector of (1) above, the processor in the learning mode executes: process of comparing the level of the sampled noise with the threshold; process of measuring the duration time of the noise if the level of the noise is the threshold or more; and process of resetting a value of the determination time to a value of the noise duration time or more.

(3) It is preferred that, in the discharge detector of (2) above, the duration time of the noise is set to have an upper limit, and the processor in the learning mode executes process of determining that discharge has occurred if the duration time of the sampled noise is more than the upper limit.

(4) It is preferred that, in the discharge detector of (2) or (3) above, the processor in the learning mode executes process of resetting the value of the determination time to a value more than the noise duration time.

(5) It is preferred that, in the learning mode of the discharge detector of any one of (1) through (4) above, the processor is set to have an amplification factor of the amplifier, and the processor executes process of reducing the amplification factor of the amplifier if the noise level is the threshold or more.

(6) It is preferred that the discharge detector of any one of (1) through (5) above further includes an operation section for manually selecting either one of the discharge detection mode or the learning mode.

Effects of the Invention

The discharge detector of the present invention allows one or more values of the settings used for determinations whether discharge has occurred to be reset by learning the level and duration time of each noise generated by a load.

DESCRIPTION OF THE INVENTION

A discharge detector according to an embodiment of the present invention is described below with reference to the drawings.

1. Discharge Detector

Figure 1:
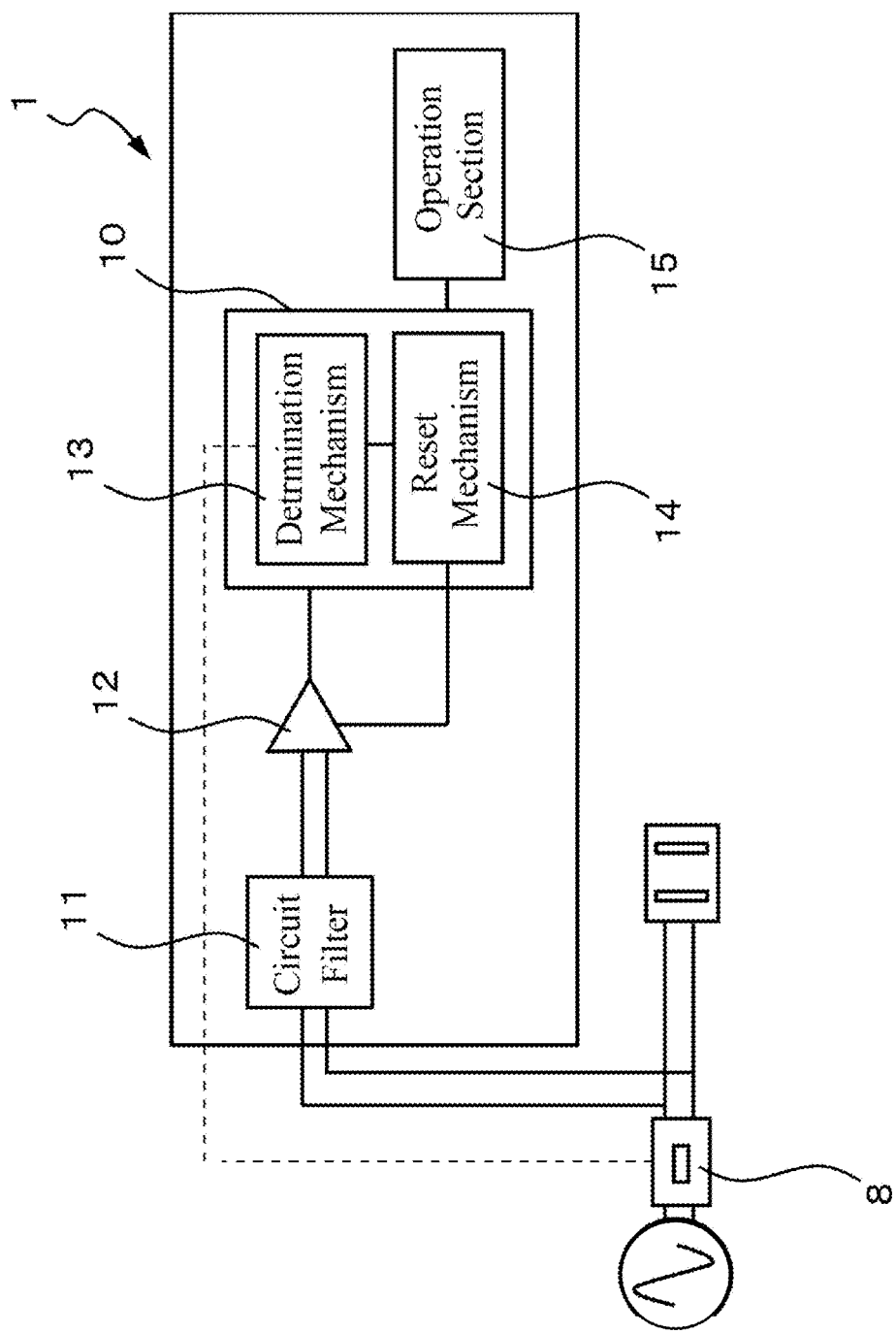
FIG. 1 is a schematic diagram illustrating a discharge detector according to an embodiment of the present invention.

FIG. 1 illustrates a discharge detector 1 in the present embodiment electrically connected to an electrical circuit. FIG. 1 also illustrates simplified indoor wiring as the electrical circuit. The indoor wiring is configured with the utility power, a breaker 8, a plug socket, and wiring electrically connecting them. To the plug socket, a load, not shown, is electrically connected. The load operates by consuming alternating current power, which is the utility power. An accident, such as tracking and a short circuit, may occur in the indoor wiring and the load. The discharge detector 1 detects discharge occurred due to an accident, such as tracking and a short circuit. The discharge detector 1 includes a filter circuit 11, an amplifier 12, a processor 10, and an operation section 15. The processor 10 includes a determination mechanism 13 and a reset mechanism 14.

The filter circuit 11 is configured by, for example, connecting a capacitor and a resistor, not shown, in parallel to an electrical circuit. The filter circuit 11 removes the utility frequency and passes noises in a predetermined frequency range. In the present embodiment, the noise means a voltage and is output from both ends of the resistor constituting the filter circuit 11. The amplifier 12 amplifies the level of the noise passed through the filter circuit 11. The processor 10 detects occurrence of discharge based on the noise level amplified by the amplifier 12.

In this situation, the processor 10 in the present embodiment selectively executes either one of a discharge detection mode or a learning mode based on a signal output from the operation section 15. The determination mechanism 13 is a program to cause the processor 10 to execute process in the discharge detection mode. The reset mechanism 14 is a program to cause the processor 10 to execute process in the learning mode.

The processor 10 in the discharge detection mode determines whether the noise level is a preset threshold or more. If a determination is made that the noise level is the threshold or more, the processor 10 measures a duration time of the noise. The duration time of the noise is measured until the noise level becomes less than the threshold. The processor 10 then compares the value of the noise duration time with the value of a preset determination time (e.g., 500 ms). If the result of the comparison indicates that the value of the noise duration time is the value of the determination time or more, the processor 10 determines that discharge has occurred. Based on the result of the determination, the processor 10 detects occurrence of discharge. The processor 10 having detected the occurrence of discharge executes, for example, process for interrupting the breaker 8, process for issuing an alarm, and the like.

The processor 10 in the learning mode executes process of sampling noises at the levels of the threshold or more and resetting one or more values of the settings used for determinations whether discharge has occurred based on the result of the sampling. The resetting of the one or more values of the settings in the learning mode causes a change in criteria for determination of occurrence of discharge in the discharge detection mode. As a result, the discharge detection sensitivity of the processor 10 is corrected to a higher or lower level.

The values of the settings used for determinations whether discharge has occurred include the threshold and value of the determination time described above and a value of an amplification factor of the amplifier 12. The value of the threshold is set in both the determination mechanism 13 and the reset mechanism 14. The value of the determination time is set in the determination mechanism 13. The amplification factor is set in the amplifier 12. Each value of the threshold, the determination time, and the amplification factor is set, for example, before shipment of the discharge detector 1 from the factory.

For example, at the beginning of installing the discharge detector 1 in an electrical circuit, the discharge detection mode is selected to monitor occurrence of discharge. In this case, the processor 10 determines whether discharge has occurred based on the initial settings before shipment from the factory. Then, various loads electrically connected to the electrical circuit are caused to operate as usual. For example, if the processor 10 makes an erroneous determination of occurrence of discharge due to a noise generated by normal operation of such a load, the learning mode is selected to reset the values of the settings before shipment from the factory. The resetting causes the discharge detection sensitivity of the processor 10 to be corrected to a lower level. As another example, if the processor 10 does not detect discharge at all for a long period of time even after installation of the discharge detector 1, the learning mode is selected to reset the values of the settings before shipment from the factory. The resetting causes the discharge detection sensitivity of the processor 10 to be corrected to a higher level.

It should be noted that the discharge detection mode for the first time since the introduction of the discharge detector 1 in the present embodiment is preferably executed while all loads electrically connected to the electrical circuit do not operate. This allows confirmation of whether an accident, such as disconnection and current leakage, occurs in the electrical circuit itself.

2. Process in Learning Mode

The process in the learning mode executed by the processor 10 is then described with reference to FIGS. 2 through 8.

2.1 Resetting of Determination Time

As described above, the processor 10 in the discharge detection mode determines that discharge has occurred if the value of the duration time of the noise at the level of the threshold or more is the value of the preset determination time (e.g., 500 ms) or more. If the learning mode is selected, the processor 10 then executes process of resetting the value of the current setting of the determination time.

Figure 2:
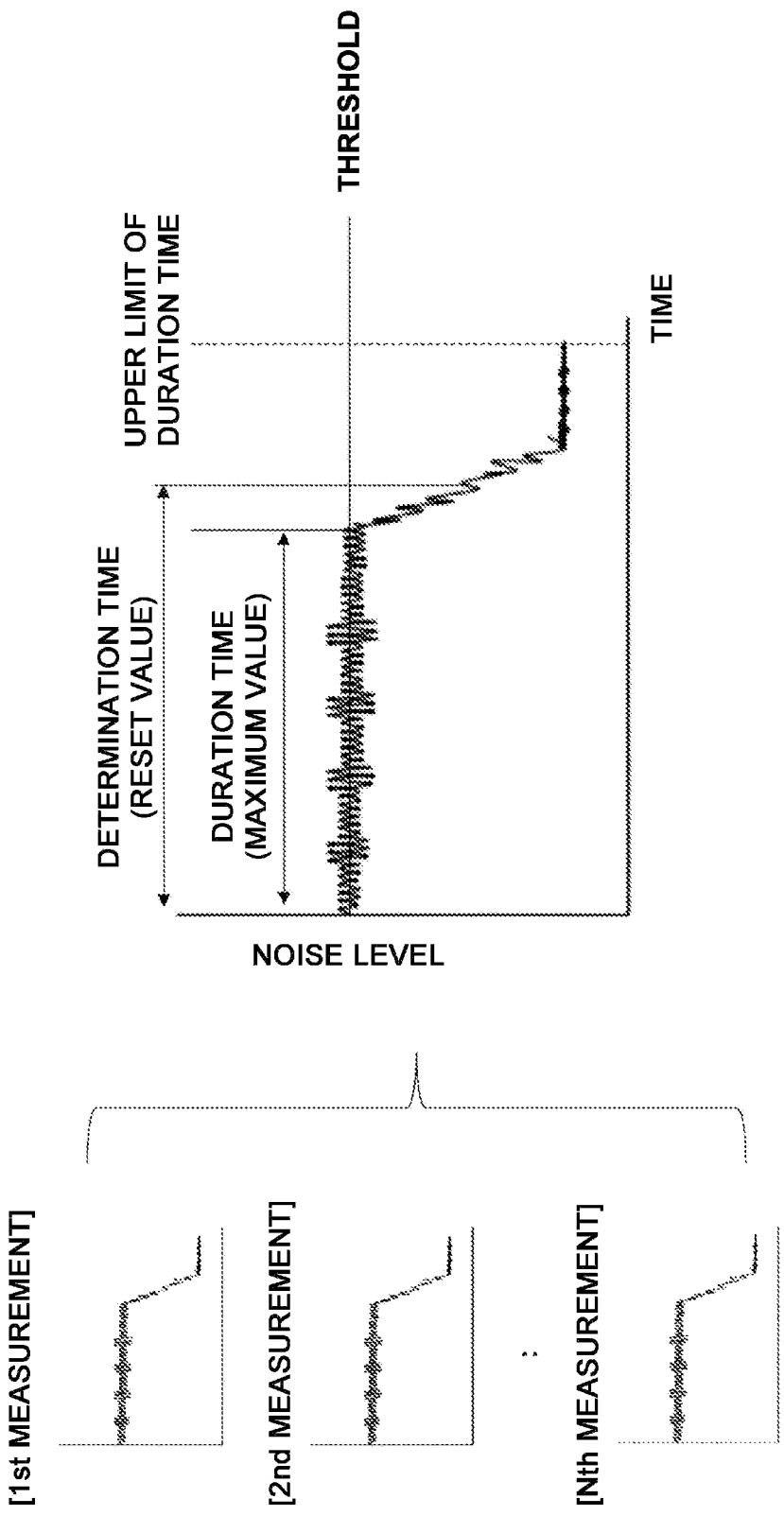
FIG. 2 is a waveform diagram illustrating relationship between the noise level and time.

As illustrated in FIG. 2, in the learning mode, the processor 10 executes process of sampling the noises at the levels of the threshold or more. The noise sampling process is executed without limiting the number of times in a preset learning period. The processor 10 determines whether the level of each noise output from the amplifier 12 is the threshold or more. If a determination is made that the level of a noise is the threshold or more, the processor 10 measures the duration time of the noise. The processor 10 causes a memory, not shown, to store first through Nth measurement results in the learning period. After passing the learning period, the processor 10 calculates a new value of the setting of the determination time based on the noise duration times, which are the first through Nth measurement results. For example, the processor 10 determines any of the maximum value, the median value, or the average value of the noise duration times, which are the first through Nth measurement results, as the new value of the setting of the determination time. The processor 10 resets the determination time from the value of the current setting to the new value of the settings.

In this situation, if the processor 10 makes an erroneous determination of occurrence of discharge due to a noise generated by normal operation of a load, it is preferred as illustrated in FIG. 2 that a value more than the maximum value of the duration times of the sampled noises is determined as the new value of the setting of the determination time. This causes the discharge detection sensitivity of the processor 10 to be corrected to a lower level and prevents erroneous determinations of occurrence of discharge by the processor 10. For example, the processor 10 determines a value 1.1 to 1.2 times the maximum value of the duration times of the sampled noises as the new value of the setting of the determination time.

2.2 Upper Limit of Duration Time

Figure 3:
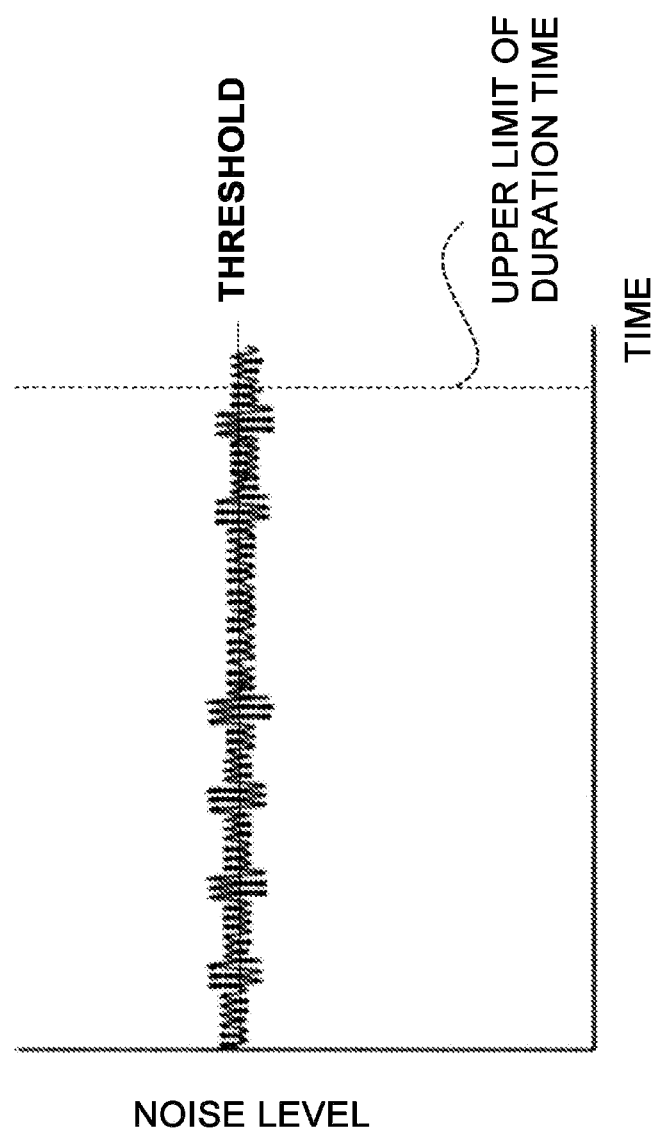
FIG. 3 is a waveform diagram illustrating relationship between the noise level and time and illustrates that the noise level of the threshold or more continues for more than the upper limit of the duration time.

In the learning mode described above, although measuring the duration time of each noise at a level of the threshold or more, the processor 10 does not determine occurrence of discharge by comparing the duration time of the noise with the determination time. As illustrated in FIG. 3, in the learning mode, an upper limit is thus set on the duration time of the noise measured by the processor 10. The processor 10 determines that discharge has occurred if the value of the noise duration time under measurement exceeds the preset upper limit. Based on the result of the determination, the processor 10 detects occurrence of discharge. The processor 10 having detected the occurrence of discharge executes, for example, process for interrupting the breaker 8, process for issuing an alarm, and the like.

2.3 Learning Period

As described above, in the learning mode, the learning period is set for sampling the noises at the levels of the threshold or more by the processor 10. The length of the learning period may be set in, for example, hours, days, weeks, or months. The learning period may also be set by combining two or more of hours, days, weeks, and months. For example, for the discharge detector 1 to be installed in indoor wiring of a fully automated factory, the learning period is preferably set in a day or a week. In particular, a learning period of a week allows calculation of the optimal value of the setting of the determination time by executing the sampling process by the processor 10 on weekdays and holidays and sampling noises from various devices operating in the factory without omission.

Figure 4:
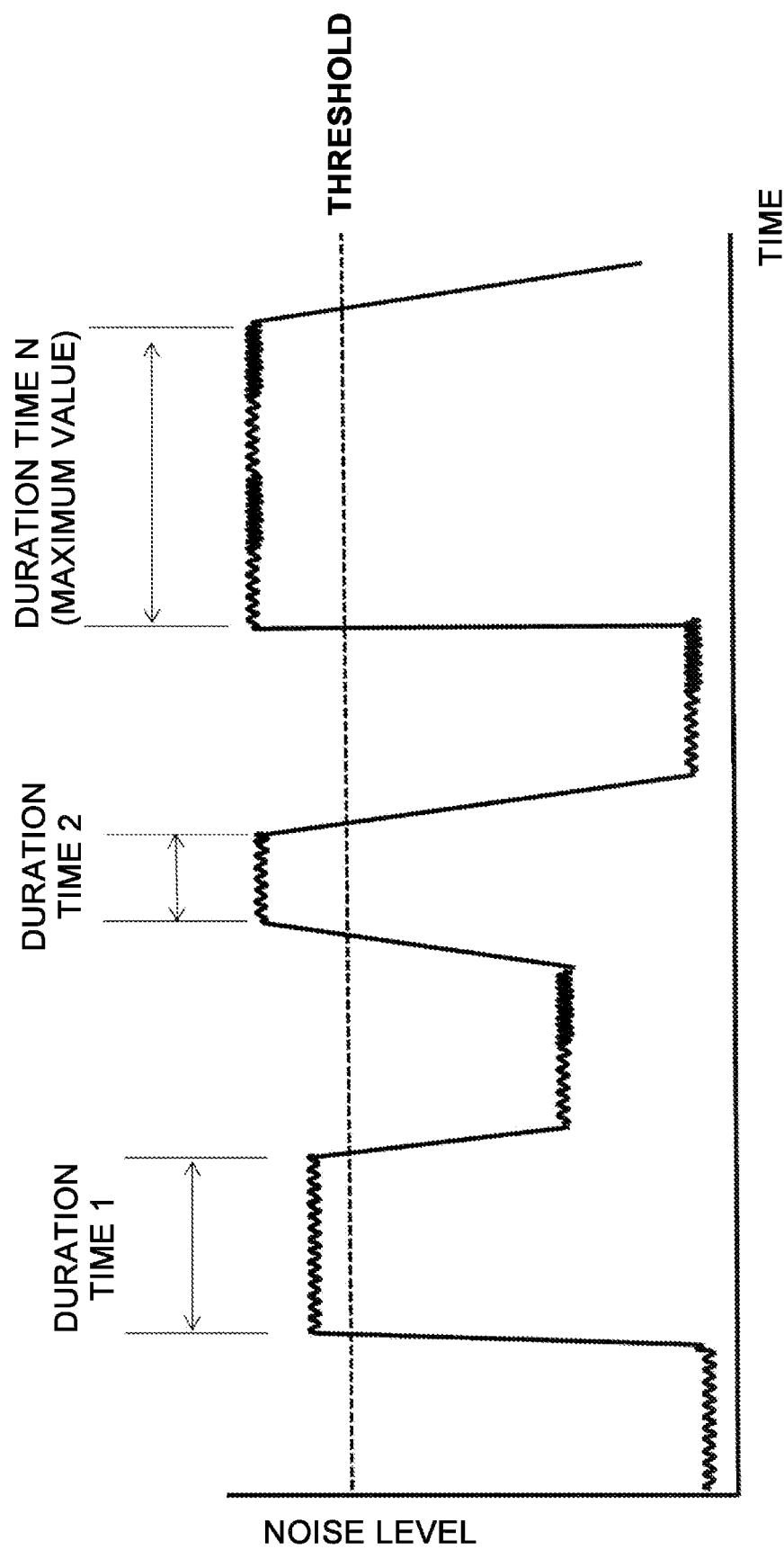
FIG. 4 is a waveform diagram illustrating relationship between the noise level and time and illustrates a plurality of noises detected in a predetermined time.

For example, if the learning period is set in hours, the processor 10 executes the process of sampling noises at levels more than the threshold for the time (e.g., 24 hours) set as the learning period. As a result, as illustrated in FIG. 4, duration times 1 through N of the plurality of noises detected in the predetermined time are sampled. Based on the duration times 1 through N of the noises, the processor 10 calculates a new value of the setting of the determination time.

As another example, the learning period may be a combination of a day and hours. In this case, the processor 10 executes the process of sampling noises at levels more than the threshold for given hours (e.g., from 9:00 to 17:00) in a day. As still another example, the learning period may be a combination of a week and hours. In this case, the processor 10 executes the process of sampling noises at levels more than the threshold for given hours every day in the week. As even another example, the learning period may be a combination of a month, weeks, days, and hours. In this case, the processor 10 executes the process of sampling noises at levels more than the threshold for given hours on given days every week in the month.

It should be noted that the learning mode is initiated by manually operating the operation section 15 of the discharge detector 1. For example, if the learning period is set in a length of hours (e.g., 1 hour), the processor 10 immediately executes the process of sampling noises at levels more than the threshold based on the signal from the operation section 15. As another example, if a start time and an end time are set for the learning period, the processor 10 executes the process of sampling noises at levels more than the threshold at a preset start time (e.g., 9:00) based on the signal from the operation section 15.

2.4 Resetting of Amplification Factor

Figure 5:
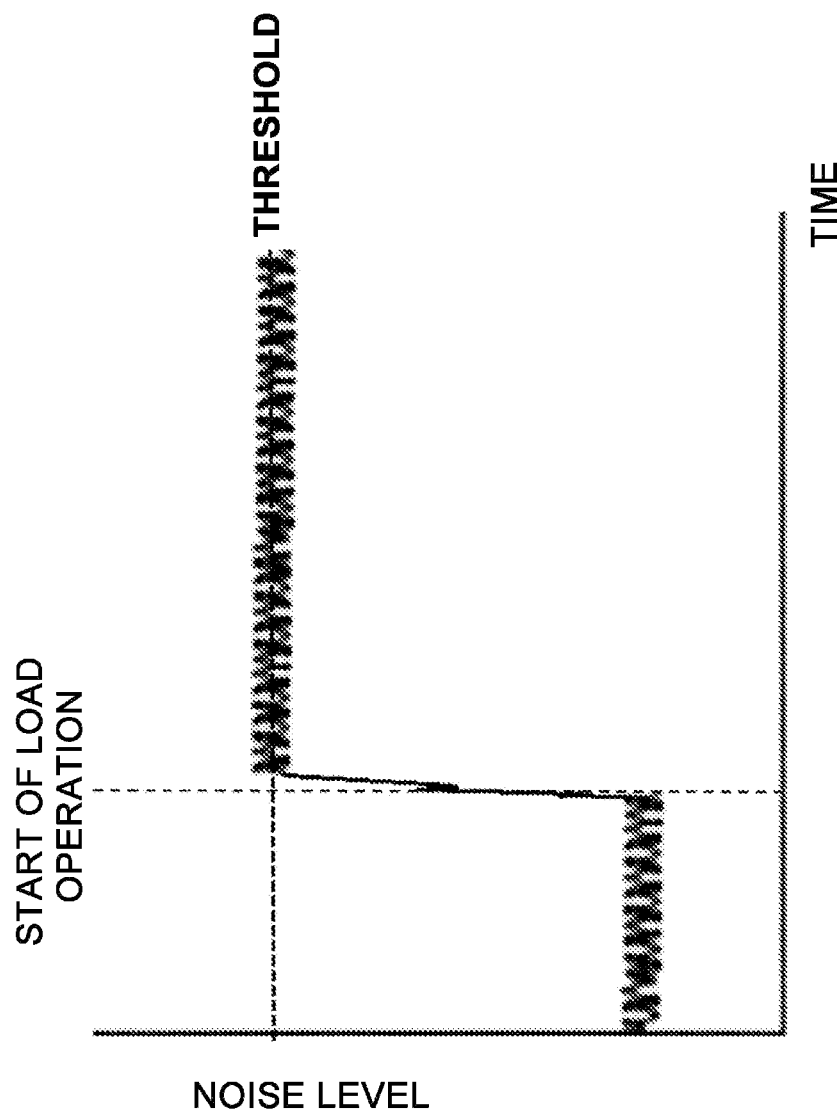
FIG. 5 is a waveform diagram illustrating relationship between the noise level and time and illustrates the timing of the start of load operation and the noise level of the threshold or more.

FIG. 5 illustrates a noise at the level of the threshold or more generated by normal operation of a load. As illustrated in FIG. 5, the level of the noise generated by a load increases immediately after the load starts operating and reaches the threshold. When the duration time of the noise reaches the determination time or more, the processor 10 makes an erroneous determination of occurrence of discharge. As described above, the processor 10 resets the value of the determination time in the learning mode to prevent such an erroneous determination. As another way to prevent erroneous determinations of occurrence of discharge, the processor 10 in the learning mode resets the amplification factor of the amplifier 12.

Figure 6:
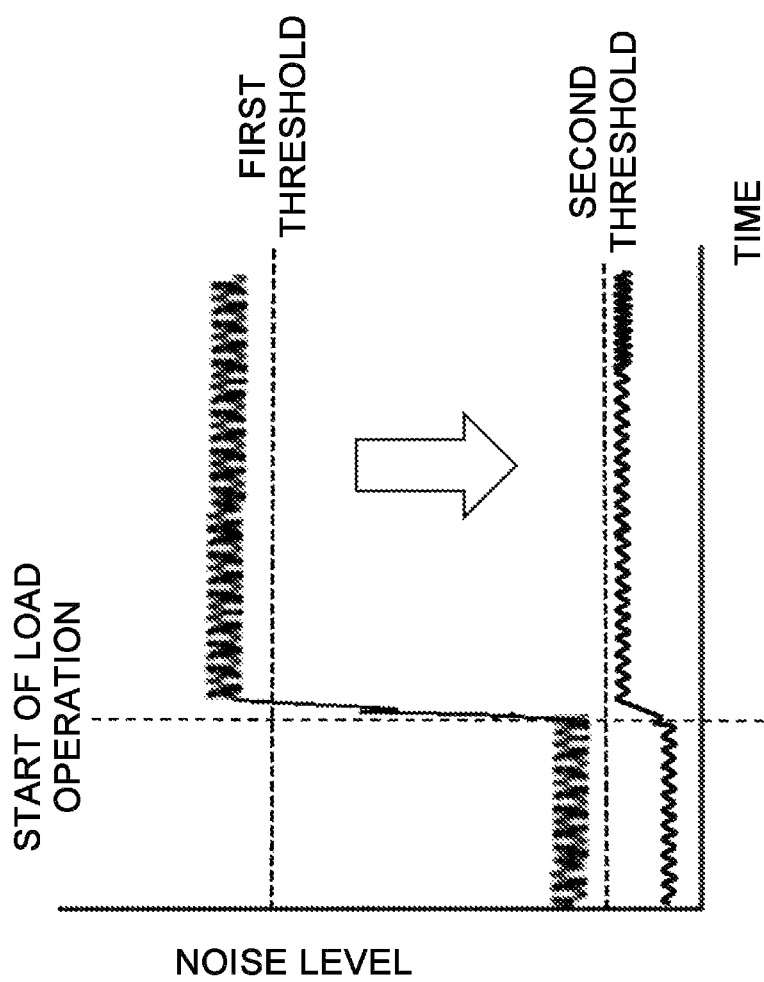
FIG. 6 is a waveform diagram illustrating relationship between the noise level and time and illustrates a noise level made to be less than a first threshold by reducing the amplification factor of an amplifier.

As illustrated in FIG. 6, in the sampling process in the learning mode, the processor 10 executes process of reducing the amplification factor of the amplifier 12 if the level of a noise output from the amplifier 12 is a first threshold or more. The first threshold is the same value as the "threshold" used for determinations of occurrence of discharge in the discharge detection mode and is referred to as the "first threshold" for convenience of description. As already described, the first threshold is set in both the determination mechanism 13 and the reset mechanism 14 illustrated in FIG. 1.

The processor 10 then compares the level of the noise output from the amplifier 12 and having the reduced amplification factor with a second threshold. The second threshold is a value smaller than the first threshold and is set in the reset mechanism 14. If the noise level is the second threshold or more, the processor 10 reduces the amplification factor of the amplifier 12 again and compares the noise level with the second threshold. Meanwhile, if the noise level is less than the second threshold, the processor 10 terminates the process of reducing the amplification factor of the amplifier 12. Due to the above-described process of resetting the amplification factor, the level of the load noise illustrated in FIG. 6 is reduced to substantially less than the first threshold used for determinations of occurrence of discharge. Accordingly, the load noise does not cause an erroneous determination of occurrence of discharge.

In this situation, reduction in the amplification factor of the amplifier 12 leads to a decrease in the discharge detection sensitivity of the processor 10. However, the level of a noise superimposed on the voltage by discharge is incomparably high with the level of the load noise. The reduction in the amplification factor of the amplifier 12 to prevent the level of the load noise from reaching the first threshold or more thus does not affect the detection of discharge. The reduction in the amplification factor of the amplifier 12 to an optimal value allows the processor 10 to accurately detect only occurrence of discharge while ignoring the load noise.

Figure 7:
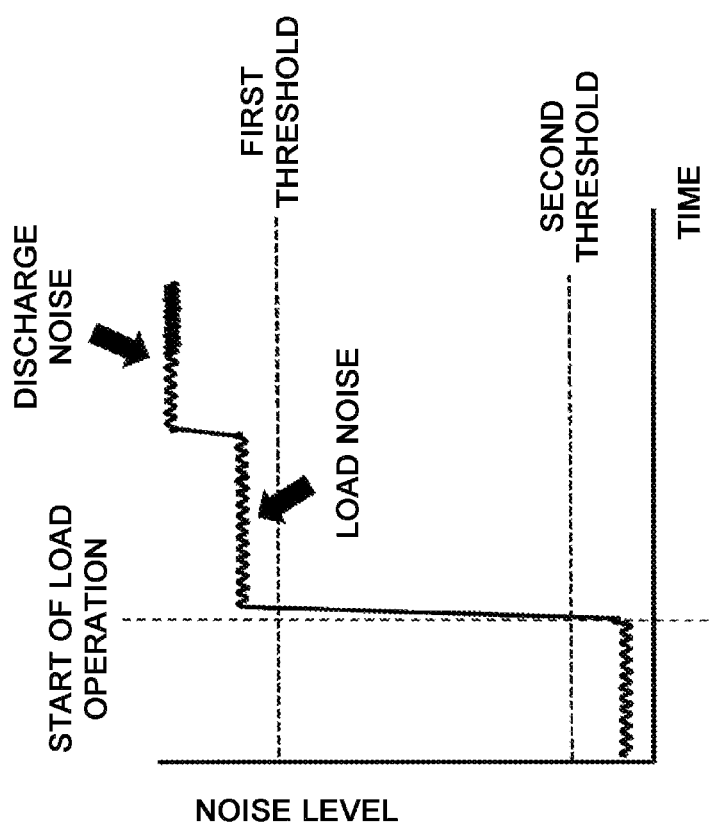
FIG. 7 is a waveform diagram illustrating relationship between the noise level and time and illustrates the timing of the start of load operation, a noise level of the first threshold or more, and a noise level of discharge.

For example, FIG. 7 illustrates the behavior of the noise level in the case that discharge occurs in succession to the start of load operation. As illustrated in FIG. 7, if the processor 10 does not execute the process of reducing the amplification factor of the amplifier 12 at the time of detecting a load noise at a level more than the first threshold, the waveform of the level of the load noise turns out to be followed by the waveform of the noise level of discharge occurred later, causing difficulty in specifying the timing of the occurrence of the discharge.

Figure 8:
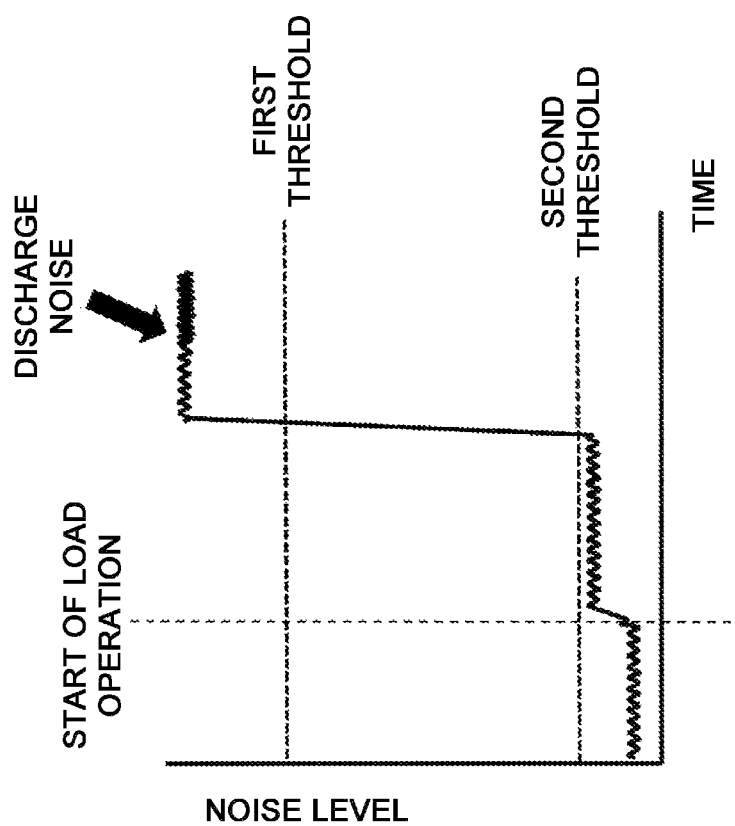
FIG. 8 is a waveform diagram illustrating relationship between the noise level and time and illustrates that only the noise level of discharge exceeds the first threshold by reducing the amplification factor of the amplifier.

Meanwhile, as illustrated in FIG. 8, if the processor 10 executes the process of reducing the amplification factor of the amplifier 12 at the time of detecting a load noise at a level more than the first threshold, the level of the load noise is reduced to substantially less than the first threshold. This causes only the noise level of a discharge phenomenon to exceed the first threshold.

In the learning mode, if executing the process of reducing the amplification factor of the amplifier 12, the processor 10 determines that discharge has occurred at the time of detecting a noise at the level of the first threshold or more. Based on the result of the determination, the processor 10 detects occurrence of discharge. The processor 10 having detected the occurrence of discharge executes, for example, process for interrupting the breaker 8, process for issuing an alarm, and the like.

2.5 Operation Section

The operation section 15 illustrated in FIG. 1 is provided to manually select either one of the discharge detection mode or the learning mode. The operation section 15 has a configuration that is not particularly limited and may be, for example, a simple switch or button. The operation section 15 may also be configured with a plurality of switches or buttons. In this case, to any of the plurality of switches or buttons, a function except for selecting either one of the discharge detection mode or the learning mode may be assigned. For example, a function of initializing the reset values of the threshold and determination time and the value of the amplification factor of the amplifier 12 to the initial values of the settings before shipment from the factory may be assigned to any of the plurality of switches or buttons. Moreover, the operation section 15 may be configured with a touch screen to display images of such a plurality of switches or buttons.

3. Others

The discharge detector of the present invention is not limited to the embodiment described above. For example, in the embodiment described above, the processor 10 determines whether discharge has occurred based on the noise superimposed on the voltage. However, the processor 10 is also capable of determining whether discharge has occurred based on a noise superimposed on the current. For example, it is possible to detect a noise of the threshold or more superimposed on the current by converting power of an alternating current, which is the utility power, to a direct current by a CT (current transformer).

The discharge detector 1 in the present embodiment constitutes one unit independent of other devices. However, the discharge detector 1 may be built in a circuit constituting another device. For example, all the components constituting the discharge detector 1 may be built in a distribution board provided with a plurality of breakers. Moreover, among the components of the discharge detector 1, the filter circuit 11 and the amplifier 12 may be built in a distribution board and the processor 10 and the operation section 15 may constitute one unit independent of the distribution board. In this case, information on the noise level output from the amplifier 12 is input to the processor 10 via wireless or wired communication. The unit including the processor 10 and the operation section 15 is installed in a location allowing a user to readily operate the unit.

DESCRIPTION OF REFERENCE NUMERALS

1 Discharge Detector
10 Processor
11 Filter Circuit
12 Amplifier
13 Determination Mechanism
14 Reset Mechanism
15 Operation Section

The invention claimed is:

1. A discharge detector for detecting discharge occurred in an electrical circuit with an electrically connected load based on a noise superimposed on a voltage or current, the discharge detector comprising:
   a filter circuit configured to pass the noise in a predetermined frequency range; an amplifier configured to amplify a level of the noise passed through the filter circuit; a processor configured to detect occurrence of discharge based on the noise level amplified by the amplifier; and a storage medium containing a program for operating the processor, wherein the program is set to have a threshold related to the noise level and a determination time related to a duration time of the noise, the processor is configured to selectively execute either one of a discharge detection mode or a learning mode according to the program, the processor in the discharge detection mode is configured to determine whether discharge has occurred by comparing the duration time of the noise at a level of the threshold or more with the determination time, and the processor in the learning mode is configured to execute steps of:

comparing the level of the noise with the threshold;

measuring the duration time of the noise if the level of the noise is the threshold or more; and resetting a value of the determination time to a value more than the noise duration time.

2. The discharge detector according to claim 1, wherein the processor in the learning mode is configured to sample the noise at the level of the threshold or more and to reset a value of the threshold to a value more than the level of the noise based on a result of the sampling.

3. The discharge detector according to claim 2, wherein the program is set to have an amplification factor of the amplifier, and the processor in the learning mode is configured to reduce the amplification factor of the amplifier if the noise level is the threshold or more.

4. The discharge detector according to claim 3, further comprising an operation section for manually selecting either one of the discharge detection mode or the learning mode.

5. The discharge detector according to claim 2, further comprising an operation section for manually selecting either one of the discharge detection mode or the learning mode.

6. The discharge detector according to claim 1, wherein the program is set to have an amplification factor of the amplifier, and the processor in the learning mode is configured to reduce the amplification factor of the amplifier if the noise level is the threshold or more.

7. The discharge detector according to claim 6, further comprising an operation section for manually selecting either one of the discharge detection mode or the learning mode.

8. The discharge detector according to claim 1, further comprising an operation section for manually selecting either one of the discharge detection mode or the learning mode.

* * * * *